United States Patent
Zhang

(10) Patent No.: US 7,469,133 B2
(45) Date of Patent: Dec. 23, 2008

(54) RADIO FREQUENCY POWER DETECTOR

(75) Inventor: Liyang Zhang, West Hills, CA (US)

(73) Assignee: Silicon Storage Technology, Inc., Sunnyvale, CA (US)

( * ) Notice: Subject to any disclaimer, the term of this patent is extended or adjusted under 35 U.S.C. 154(b) by 435 days.

(21) Appl. No.: 11/407,569

(22) Filed: Apr. 19, 2006

(65) Prior Publication Data

US 2007/0249310 A1    Oct. 25, 2007

(51) Int. Cl.
*H04B 1/06* (2006.01)
(52) U.S. Cl. .................. 455/234.1; 455/321; 455/333; 455/341; 330/285; 330/296; 330/140; 330/302
(58) Field of Classification Search .............. 455/234.1, 455/333, 321, 341; 330/285, 296, 302, 140
See application file for complete search history.

(56) References Cited

U.S. PATENT DOCUMENTS 4,167,681 A * 9/1979 Wolkstein et al. ........... 327/318
6,690,237 B2 * 2/2004 Miyazawa .................. 330/285
7,071,783 B2 * 7/2006 Ichitsubo et al. ............ 330/285
2007/0030064 A1 * 2/2007 Yu ............................ 330/140

* cited by examiner

*Primary Examiner*—Sanh D Phu
(74) *Attorney, Agent, or Firm*—DLA Piper LLP (US)

(57) ABSTRACT

RF power detector employing an envelope amplifier circuit and a current mirror circuit. The output of the current mirror circuit supplies a bias voltage for biasing the output of the envelope amplifier circuit. Furthermore, the output of the envelope amplifier circuit is fed back to the output of the current mirror circuit so as to reduce the magnitude of the bias signal according to the magnitude of the amplified RF signal envelope. In this manner, the overall gain of the RF power detector can be selectively reduced, resulting in an RF power detector having a more linearized dynamic range and greater ability to compensate for variation in gain caused by temperature.

24 Claims, 3 Drawing Sheets

RADIO FREQUENCY POWER DETECTOR

BRIEF DESCRIPTION OF THE INVENTION

This invention relates generally to a radio frequency circuit. More specifically, this invention relates to a radio frequency power detector circuit.

BACKGROUND OF THE INVENTION

Radio frequency (RF) power detector circuits are often employed to measure the power of RF signals. This power measurement has a number of uses, including controlling the output of RF amplifiers in order to increase their efficiency and ensure that they are transmitting RF signals at appropriate amplitudes.

As RF power detectors are used to measure power, a number of characteristics are desirable. For example, one desirable attribute of RF power detectors is linear response within their normal dynamic range, so as to ensure predictability and accuracy of measurement. Another desirable attribute is temperature compensation, as power detectors whose outputs vary with operating temperature are, in general, less predictable. Yet another desirable attribute is directional coupling. More specifically, it is often desirable for RF power detectors to be sensitive only to power delivered by the RF signal source to be monitored, and insensitive to other sources of RF signals, such as reflected signals and ambient noise.

In view of these attributes, continuing efforts exist to improve the various characteristics of RF power detector circuits.

SUMMARY OF THE INVENTION

The invention can be implemented in numerous ways, including as a method and an apparatus. Various embodiments of the invention are discussed below.

In one embodiment of the invention, a radio frequency power detector comprises an input configured to receive a first radio frequency signal, and an envelope amplifier circuit in electrical communication with the input, and configured to output a second radio frequency signal corresponding to an amplified envelope of the first radio frequency signal. The radio frequency power detector also includes a current mirror circuit in electrical communication with the envelope amplifier circuit, and configured to output a bias signal for biasing the second radio frequency signal. The envelope amplifier circuit is further configured to feed the second radio frequency signal back to the current mirror circuit so as to reduce a magnitude of the bias signal according to a magnitude of the second radio frequency signal.

In a further embodiment of the invention, a method of detecting the power of radio frequency signals comprises providing an input configured to receive a first radio frequency signal, and providing an envelope amplifier circuit in electrical communication with the input, and configured to output a second radio frequency signal corresponding to an amplified envelope of the first radio frequency signal. The method also includes providing a current mirror circuit in electrical communication with the envelope amplifier circuit, and configured to output a bias signal for biasing the second radio frequency signal. The envelope amplifier circuit is further configured to feed the second radio frequency signal back to the current mirror circuit so as to reduce a magnitude of the bias signal according to a magnitude of the second radio frequency signal.

Other aspects and advantages of the invention will become apparent from the following detailed description taken in conjunction with the accompanying drawings which illustrate, by way of example, the principles of the invention.

BRIEF DESCRIPTION OF THE DRAWINGS

The invention, together with further objects and advantages thereof, may best be understood by reference to the following description taken in conjunction with the accompanying drawings in which.

Like reference numerals refer to corresponding parts throughout the drawings. Also, it is understood that the depictions in the figures are diagrammatic and not necessarily to scale.

DETAILED DESCRIPTION OF EMBODIMENTS OF THE INVENTION

In one embodiment of the invention, an RF power detector employs an envelope amplifier circuit and a current mirror circuit. The output of the current mirror circuit supplies a bias voltage for biasing the output of the envelope amplifier circuit. Furthermore, the output of the envelope amplifier circuit is fed back to the output of the current mirror circuit so as to reduce the magnitude of the bias signal according to the magnitude of the amplified RF signal envelope. In this manner, the overall gain of the RF power detector can be selectively reduced, resulting in an RF power detector having a more linearized dynamic range and greater ability to compensate for variation in gain caused by temperature.

Figure 1A:
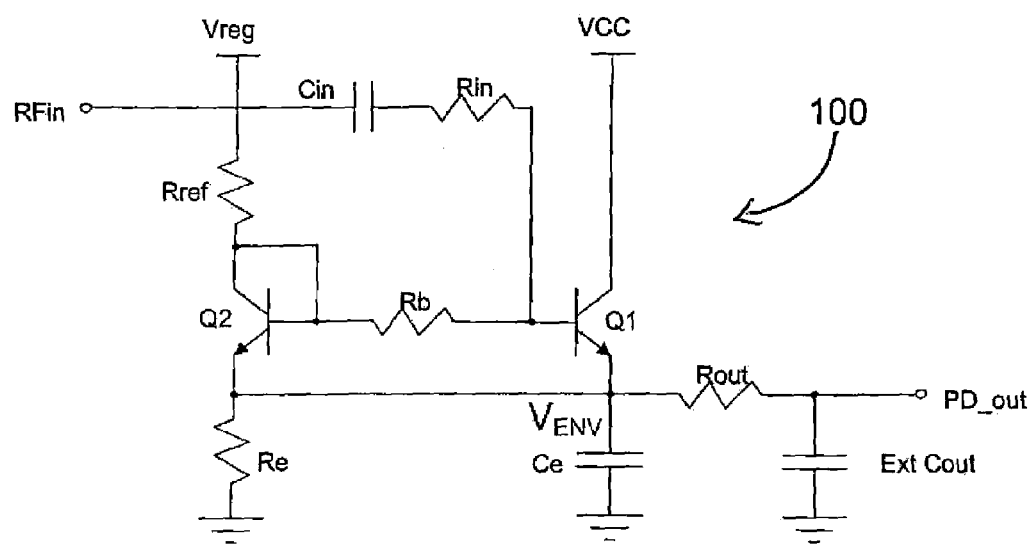
FIG. 1A is a schematic of an RF power detector circuit constructed in accordance with one embodiment of the present invention.

FIG. 1A is a schematic of an RF power detector circuit constructed in accordance with embodiments of the present invention. The power detector circuit 100 includes an input $RF_{in}$ connected to the base terminals of transistors Q1 and Q2. Voltage source VCC supplies a voltage signal to the collector terminal of transistor Q1, while the emitter terminal of transistor Q1 outputs the resulting source voltage to output PD_out, the output of the power detector circuit 100. In operation, transistor Q1 receives an RF signal from the input $RF_{in}$ at its base terminal, which thus acts to regulate the voltage out to PD_out. As VCC typically supplies voltages of greater magnitude than the $RF_{in}$ signal, transistor Q1 acts as a variable gain envelope amplifier, effectively amplifying the received RF signal.

Figure 1B:
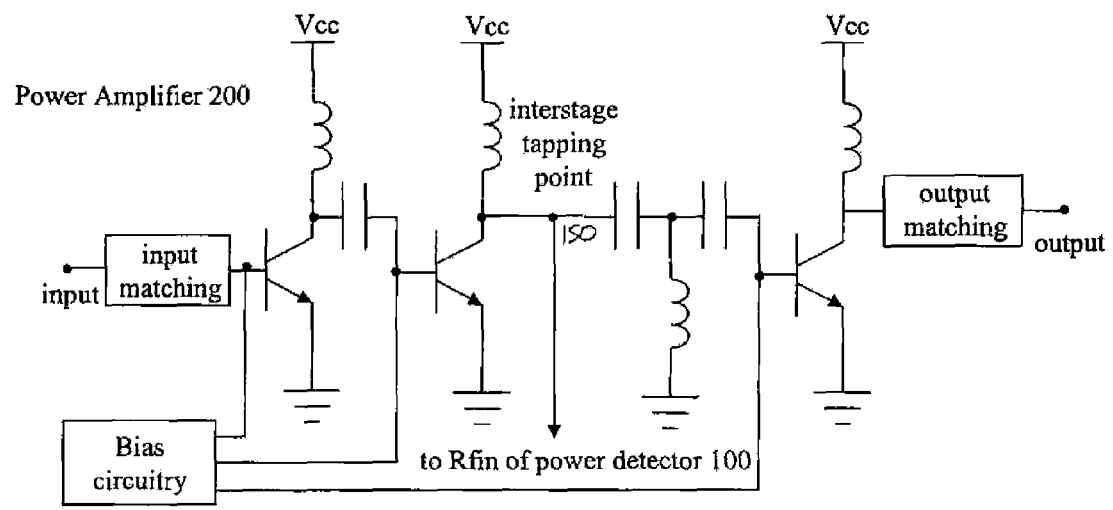
FIG. 1B is a schematic of a power amplifier circuit, illustrating tapping points for RF power detector circuits constructed in accordance with the invention.

The input $RF_{in}$ is also connected to a capacitor $C_{in}$ and resistor $R_{in}$ connected in series to act as a tapping network. The values of $C_{in}$ and $R_{in}$ are typically set to allow a proper tap ratio for maintaining the performance of the power amplifier. That is, they are set to allow for frequency compensation over the power amplifier's operating band. In addition, as shown in FIG. 1B, the tapping point 150 for the tapping network of the power detector circuit 100 is typically at one of the interstages of the power amplifier 200, so as to employ reverse insulation of one or more power amplifier stages, filtering out undesired signals such as those generated by reflections caused by output load mismatch.

Voltage source $V_{reg}$ supplies a bias voltage signal to the collector terminal of transistor Q2, while the emitter terminal of transistor Q2 outputs the resulting bias voltage to PD_out, biasing the output of transistor Q1. Like transistor Q1, transistor Q2 has its base terminal in electrical communication with input $RF_{in}$. Accordingly, voltage source $V_{reg}$ and transistor Q2 act as a current mirror circuit, providing signals to PD_out that mirror those from the variable gain envelope amplifier circuit (e.g., VCC and transistor Q1). In addition, as the emitter terminals of transistors Q1 and Q2 are connected, the voltage output of Q1 is fed back to Q2, reducing the bias voltage by an amount corresponding to the output of Q1. In this manner, the outputs of Q1 and Q2 are arranged so as to effectively form an automatic gain control (AGC) loop that regulates the gain of the power detector circuit 100. One of ordinary skill will observe that by reducing the bias voltage by an amount that scales with the amplified RF signal, the response of the power detector circuit 100 is linearized to a greater degree than conventional RF power detectors. Indeed, exemplary component values of $C_{in}$=50 fF, $R_{in}$=300 Ω, $V_{reg}$=2.8V, $R_{ref}$=5 kΩ, $V_{cc}$=3.3V, $R_b$=1 kΩ, Q1=Q2=3×2.8 μm², $R_e$=2.5 kΩ, $C_e$=3 pF, $R_{out}$=5 kΩ, and Ext Cout=5 pF, can result in a 25 dB linearized dynamic range.

Other components of RF power detector 100 perform additional functions. A resistor $R_e$ and capacitor $C_e$ are connected in parallel, with one terminal connected to the emitter terminals of Q1 and Q2 ($V_{ENV}$), and one terminal grounded. In this configuration, $R_e$ and $C_e$ collectively act as a low pass impedance filter, converting the envelope of the biased output signal $V_{ENV}$ from current to voltage while bypassing the RF components of $V_{ENV}$ to PD_out. Resistor $R_{out}$ and capacitor $C_{out}$, which can be a component external to the remainder of the power detector 100, form an additional low pass filter that can be tuned for the isolation of RF signals corresponding to video bandwidth, if desired.

In addition to providing more predictable response, the configuration of RF power detector circuit 100 confers other advantages. For example, the reduction in bias voltage due to feedback from Q1 results in reduced power consumption. The configuration of circuit 100 also compensates for temperature effects within a relatively large dynamic range.

Figure 2:
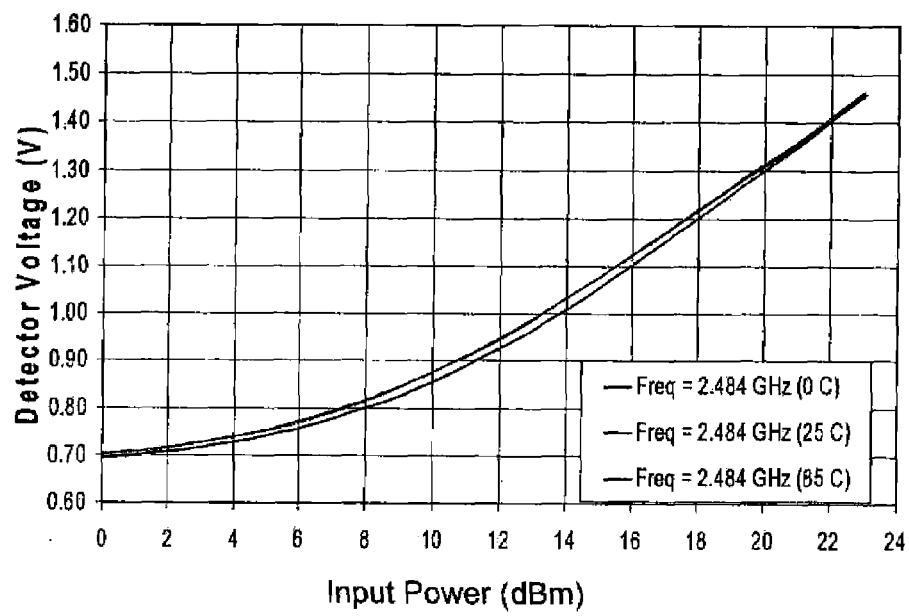
FIG. 2 is a graph of voltage output from the RF power detector circuit of FIG. 1 as a function of the power of the signal input to the circuit, for various operating temperatures.
Figure 3:
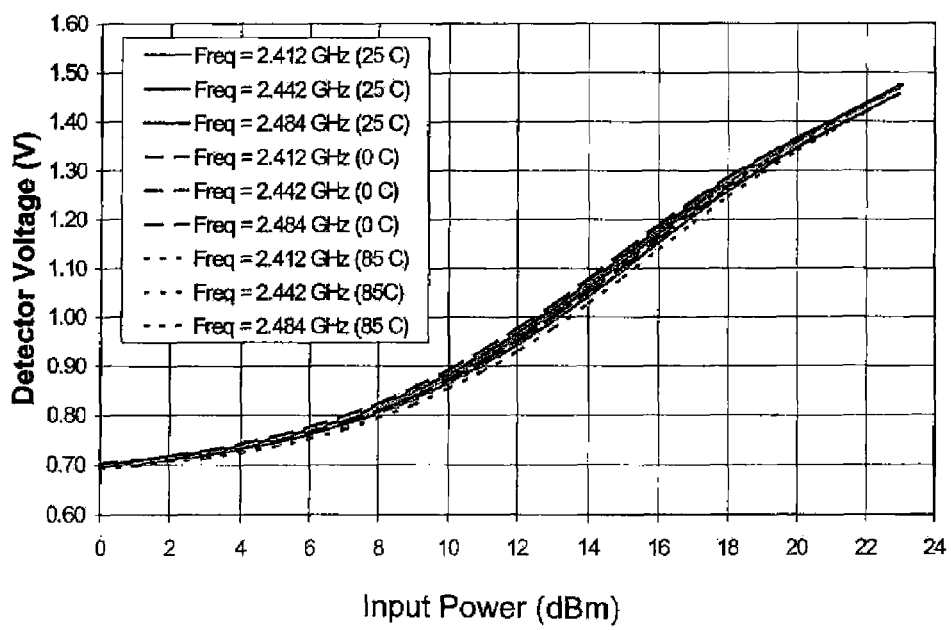
FIG. 3 further illustrates voltage output versus power input for various operating temperatures.

FIGS. 2 and 3 are graphs of voltage output from a representative RF power detector circuit 100 as a function of the power of the signal input to the circuit, for various operating temperatures. As an aside, it should be noted that the invention encompasses varying properties of the various components of circuit 100. Accordingly, while the results shown in FIGS. 2 and 3 can vary, the figures nevertheless serve to illustrate concepts in accordance with the invention.

FIGS. 2 and 3 illustrate that the AGC loop helps compensate for detector gain variations with temperature. That is, it is known that RF power detector gain varies with temperature, as the behavior of transistors Q1 and Q2 changes according to their temperature. The present circuit 100 helps compensate for these temperature variations.

More specifically, at low power levels, the variations in detector 100 gain are dominated by variations in the quiescent output voltage of transistors Q1 and Q2 with temperature. However, feedback from the output of Q1 to the output of Q2 helps compensate for this effect. Especially when the transistors Q1 and Q2 are the same or have similar properties, their quiescent output voltages will vary with temperature in the same or similar ways. Accordingly, feeding one quiescent output voltage back to the other acts to cancel or reduce the effect of both. Conversely, at higher power levels, any variations in quiescent output voltage are dominated by the magnitude of the detected, amplified RF signal. Accordingly, at higher power levels, the behavior of circuit 100 is more independent of temperature.

The above described behavior of detector 100 can be seen in FIG. 2, which illustrates the voltage response of circuit 100 as a function of input power, at temperatures of 0° C., 25° C., and 85° C. At low output power levels, the AGC loop helps cancel any gain variations caused by quiescent output voltage, and circuit 100 behaves largely the same regardless of operating temperature. Thus, at low output power levels, the various output voltage curves of FIG. 2 lie relatively close to each other. At high output power levels, variations in quiescent output voltage are dominated by the magnitude of the RF output of circuit 100. Accordingly, the output voltage curves of FIG. 2 approach each other at higher output power levels. One of ordinary skill in the art will thus observe that circuits 100 constructed in accordance with the present invention act to compensate for temperature-induced gain variations, at least for low and high output power levels.

Additional advantages are also realized by circuits 100 constructed in accordance with the principles of the invention. For example, voltage source $V_{reg}$ need only supply a relatively low-magnitude, and readily available, bias voltage (e.g., it can typically be the same power supply as that which supplies the reference voltage $V_{ref}$ in power amplifiers for CDMA, WiFi, and WiMax systems, or the power control voltage supply $V_{apc}$ in saturated power amplifiers for GSM systems). Accordingly, the design requirements for $V_{reg}$ are often relatively minimal, and the corresponding current drawn from $V_{reg}$ is typically small (often on the order of 0.3 mA). Also, turning off $V_{reg}$ results in substantially no current leakage. In addition, as voltage is fed back to the output of Q2 but not to $V_{ref}$ directly, circuit 100 maximizes the dB-wise linear range of power detection.

As a further advantage, the presence of the $R_e/C_e$ low pass filter, and the $R_{out}/C_{out}$ low pass filter allow for added flexibility in tuning the RF power detector 100 for multiple different applications. For instance, the low pass filters can be tuned so as to optimize the response of circuit 100 to video frequencies. Also, it can be observed that the circuit 100 can be constructed with a relatively small number of low-cost components.

The foregoing description, for purposes of explanation, used specific nomenclature to provide a thorough understanding of the invention. However, it will be apparent to one skilled in the art that the specific details are not required in order to practice the invention. Thus, the foregoing descriptions of specific embodiments of the present invention are presented for purposes of illustration and description. They are not intended to be exhaustive or to limit the invention to the precise forms disclosed. Many modifications and variations are possible in view of the above teachings. For example, various values of the components of RF power detector 100 can be employed, while maintaining the function of features such as the AGC loop. The embodiments were chosen and described in order to best explain the principles of the invention and its practical applications, to thereby enable others skilled in the art to best utilize the invention and various embodiments with various modifications as are suited to the particular use contemplated.

What is claimed is:

1. A radio frequency power detector, comprising:
an input configured to receive a first radio frequency signal;
an envelope amplifier circuit in electrical communication with the input, and configured to output a second radio frequency signal corresponding to an amplified envelope of the first radio frequency signal; and a current mirror circuit in electrical communication with the envelope amplifier circuit, and configured to output a bias signal for biasing the second radio frequency signal;

wherein the envelope amplifier circuit is further configured to feed the second radio frequency signal back to the current mirror circuit so as to reduce a magnitude of the bias signal according to a magnitude of the second radio frequency signal.

2. The radio frequency power detector of claim 1 wherein the biased second radio frequency signal has an associated output power that can vary over a range, and wherein the envelope amplifier circuit is further configured to feed the second radio frequency signal back to the current mirror circuit so as to facilitate the linearization of the biased second radio frequency signal over the range of the output power.

3. The radio frequency power detector of claim 2 wherein the linearized range of the output power is at least approximately 25 dB.

4. The radio frequency power detector of claim 1 wherein the magnitude of the bias signal is reduced so as to reduce a quiescent output voltage output from the current mirror circuit.

5. The radio frequency power detector of claim 1 wherein the input further comprises a tapping network configured to directionally couple the input to the envelope amplifier circuit.

6. The radio frequency power detector of claim 5 wherein the tapping network further comprises a capacitor and a resistor, the capacitor having a first terminal in electrical communication with the input and a second terminal in electrical communication with a first terminal of the resistor, the resistor having a second terminal in electrical communication with the envelope amplifier circuit.

7. The radio frequency power detector of claim 5 wherein the tapping network is further configured for electrical connection to an interstage of a power amplifier.

8. The radio frequency power detector of claim 1:
wherein the envelope amplifier circuit further comprises a first voltage source and a first transistor; and
wherein the first transistor has a collector terminal in electrical communication with the first voltage source, a base terminal in electrical communication with the input, and an emitter terminal configured to emit the second radio frequency signal.

9. The radio frequency power detector of claim 8:
wherein the current mirror circuit further comprises a second voltage source and a second transistor; and
wherein the second transistor has a collector terminal in electrical communication with the second voltage source, a base terminal in electrical communication with the input, and an emitter terminal in electrical communication with the emitter terminal of the first transistor, the emitter terminal of the second transistor configured to emit the bias signal and to receive the second radio frequency signal.

10. The radio frequency power detector of claim 9 wherein the second voltage source is further configured to provide a reference voltage to at least one of a linear power amplifier and a saturated power amplifier.

11. The radio frequency power detector of claim 8 further comprising a first low pass filter having a first filter resistor in electrical parallel with a first filter capacitor, wherein the first filter resistor and the first filter capacitor each have a first terminal in electrical communication with the emitter terminal of the first transistor and the emitter terminal of the second transistor, and a grounded second terminal.

12. The radio frequency power detector of claim 9 further comprising a second low pass filter having a second filter resistor in electrical series with a second filter capacitor;
wherein the second filter resistor has a first terminal in electrical communication with the emitter terminal of the first transistor and the emitter terminal of the second transistor, and a second terminal in electrical communication with a first terminal of the second filter capacitor; and
wherein the second filter capacitor has a grounded second terminal.

13. A method of detecting the power of radio frequency signals, comprising:
providing an input configured to receive a first radio frequency signal;
providing an envelope amplifier circuit in electrical communication with the input, and configured to output a second radio frequency signal corresponding to an amplified envelope of the first radio frequency signal; and
providing a current mirror circuit in electrical communication with the envelope amplifier circuit, and configured to output a bias signal for biasing the second radio frequency signal;
wherein the envelope amplifier circuit is further configured to feed the second radio frequency signal back to the current mirror circuit so as to reduce a magnitude of the bias signal according to a magnitude of the second radio frequency signal.

14. The method of claim 13 wherein the biased second radio frequency signal has an associated output power that can vary over a range, and wherein the envelope amplifier circuit is further configured to feed the second radio frequency signal back to the current mirror circuit so as to facilitate the linearization of the biased second radio frequency signal over the range of the output power.

15. The method of claim 14 wherein the linearized range of the output power is at least approximately 25 dB.

16. The method of claim 13 wherein the magnitude of the bias signal is reduced so as to reduce a quiescent output voltage output from the current mirror circuit.

17. The method of claim 13 wherein the input further comprises a tapping network configured to directionally couple the input to the envelope amplifier circuit.

18. The method of claim 17 wherein the tapping network further comprises a capacitor and a resistor, the capacitor having a first terminal in electrical communication with the input and a second terminal in electrical communication with a first terminal of the resistor, the resistor having a second terminal in electrical communication with the envelope amplifier circuit.

19. The method of claim 17 wherein the tapping network is further configured for electrical connection to an interstage of a power amplifier.

20. The method of claim 13:
wherein the envelope amplifier circuit further comprises a first voltage source and a first transistor; and
wherein the first transistor has a collector terminal in electrical communication with the first voltage source, a base terminal in electrical communication with the input, and an emitter terminal configured to emit the second radio frequency signal.

21. The method of claim 20:
wherein the current mirror circuit further comprises a second voltage source and a second transistor; and wherein the second transistor has a collector terminal in electrical communication with the second voltage source, a base terminal in electrical communication with the input, and an emitter terminal in electrical communication with the emitter terminal of the first transistor, the emitter terminal of the second transistor configured to emit the bias signal and to receive the second radio frequency signal.

22. The method of claim 21 wherein the second voltage source is further configured to provide a reference voltage to at least one of a linear power amplifier and a saturated power amplifier.

23. The method of claim 20 further comprising a first low pass filter having a first filter resistor in electrical parallel with a first filter capacitor, wherein the first filter resistor and the first filter capacitor each have a first terminal in electrical communication with the emitter terminal of the first transistor and the emitter terminal of the second transistor, and a grounded second terminal.

24. The method of claim 21 further comprising a second low pass filter having a second filter resistor in electrical series with a second filter capacitor;

wherein the second filter resistor has a first terminal in electrical communication with the emitter terminal of the first transistor and the emitter terminal of the second transistor, and a second terminal in electrical communication with a first terminal of the second filter capacitor; and wherein the second filter capacitor has a grounded second terminal.

* * * * *